(12) United States Patent
Shi et al.

(10) Patent No.: US 9,497,862 B2
(45) Date of Patent: Nov. 15, 2016

(54) PACKAGING STRUCTURE

(75) Inventors: Lei Shi, Nantong (CN); Yujuan Tao, Nantong (CN); Guohua Gao, Nantong (CN); Guoji Yang, Nantong (CN); Honglei Li, Nantong (CN); Haijun Shen, Nantong (CN)

(73) Assignee: Nantong Fujitsu Microelectronics Co., Ltd., Nantong (CN)

( * ) Notice: Subject to any disclaimer, the term of this patent is extended or adjusted under 35 U.S.C. 154(b) by 174 days.

(21) Appl. No.: 13/981,123

(22) PCT Filed: Jan. 20, 2012

(86) PCT No.: PCT/CN2012/070629
§ 371 (c)(1),
(2), (4) Date: Jul. 23, 2013

(87) PCT Pub. No.: WO2012/100721
PCT Pub. Date: Aug. 2, 2012

(65) Prior Publication Data
US 2013/0301228 A1    Nov. 14, 2013

(30) Foreign Application Priority Data

Jan. 30, 2011 (CN) .......................... 2011 1 0032264
Jan. 30, 2011 (CN) .......................... 2011 1 0032390
Jan. 30, 2011 (CN) .......................... 2011 1 0032402
Jan. 30, 2011 (CN) .......................... 2011 2 0032087
Jan. 30, 2011 (CN) .......................... 2011 2 0032108

(51) Int. Cl.
*H01L 23/34* (2006.01)
*H05K 1/18* (2006.01)
(Continued)

(52) U.S. Cl.
CPC ............. *H05K 1/181* (2013.01); *H01L 21/561* (2013.01); *H01L 21/568* (2013.01);
(Continued)

(58) Field of Classification Search
CPC ........... H01L 2924/15311; H01L 2924/19105; H01L 2224/97; H01L 2224/49171; H01L 2224/96; H01L 2224/94; H01L 2224/12105; H01L 2224/13022; H01L 2224/16227; H01L 2224/24137; H01L 2224/81005; H01L 23/3128; H01L 23/5389; H01L 21/568; H01L 21/6835; H01L 24/96; H01L 24/97; H01L 2221/68345; H01L 25/0655; H01L 2225/1058; H05K 1/185; H05K 3/284; H05K 3/007; H05K 2203/016; H05K 2203/1316
See application file for complete search history.

(56) References Cited

U.S. PATENT DOCUMENTS 5,405,810 A * 4/1995 Mizuno ..................... G03F 9/70
257/E23.179
8,048,719 B2   11/2011 Nishimura et al.
(Continued)

FOREIGN PATENT DOCUMENTS

CN    1387240 A    12/2002
CN    1707792 A    12/2005
(Continued)

OTHER PUBLICATIONS

International Search Report for PCT Application No. PCT/CN2012/070629 mailed Apr. 26, 2012.
(Continued)

*Primary Examiner* — Julio J Maldonado
*Assistant Examiner* — Cory Eskridge
(74) *Attorney, Agent, or Firm* — RatnerPrestia

(57) ABSTRACT

The present invention relates a packaging structure including: a carrier board and a cementing layer on the surface of the carrier board; chips and passive devices having functional side thereof attached to the cementing layer; and a sealing material layer for packaging and curing, the sealing material being formed on the carrier board on the side attached to the chips and the passive devices. The present invention integrates chips and passive devices and then packages the chips and the passive devices together, and is therefore a packaged product having not single-chip functionality but integrated-system functionality. The present invention is highly integrated, reduces interfering factors such as system-internal electric resistance and inductance, and accommodates growing demand for lighter, thinner, shorter, and smaller semiconductor packaging.

16 Claims, 6 Drawing Sheets

(51) Int. Cl.
*H01L 21/56* (2006.01)
*H01L 23/31* (2006.01)
*H01L 23/498* (2006.01)
*H01L 23/538* (2006.01)
*H01L 25/16* (2006.01)
*H01L 23/00* (2006.01)

(52) U.S. Cl.
CPC .... *H01L 23/3128* (2013.01); *H01L 23/49816* (2013.01); *H01L 23/5389* (2013.01); *H01L 24/19* (2013.01); *H01L 24/96* (2013.01); *H01L 25/165* (2013.01); *H01L 24/24* (2013.01); *H01L 2224/12105* (2013.01); *H01L 2224/24195* (2013.01); *H01L 2224/821* (2013.01); *H01L 2924/12042* (2013.01); *H01L 2924/1815* (2013.01)

(56) References Cited

U.S. PATENT DOCUMENTS

| | | | |
|---|---|---|---|
| 2002/0187588 | A1 | 12/2002 | Omizo et al. |
| 2003/0215993 | A1* | 11/2003 | Oshima ........................ 438/200 |
| 2005/0087356 | A1* | 4/2005 | Forcier ........................ 174/52.4 |
| 2005/0269128 | A1 | 12/2005 | Usui et al. |
| 2008/0122086 | A1 | 5/2008 | Tsao et al. |
| 2009/0302439 | A1* | 12/2009 | Pagaila .................. H01L 23/29 257/660 |
| 2012/0028411 | A1* | 2/2012 | Yu ........................ H01L 21/561 438/107 |
| 2012/0086003 | A1* | 4/2012 | Park ........................ H01L 21/56 257/48 |
| 2012/0098123 | A1* | 4/2012 | Yu ........................ H01L 21/563 257/737 |
| 2012/0251791 | A1* | 10/2012 | Kawai ........................ H01L 21/56 428/172 |

FOREIGN PATENT DOCUMENTS

| | | |
|---|---|---|
| CN | 101009269 A | 8/2007 |
| CN | 101174601 A | 5/2008 |
| CN | 101425469 A | 5/2009 |
| CN | 101604638 A | 12/2009 |
| CN | 102157400 A | 8/2011 |
| CN | 102157401 A | 8/2011 |
| CN | 102163603 A | 8/2011 |
| CN | 102169840 A | 8/2011 |
| CN | 102169879 A | 8/2011 |
| CN | 102176452 A | 9/2011 |
| CN | 201994277 U | 9/2011 |
| CN | 202094109 U | 12/2011 |
| JP | 1-220463 | 9/1989 |
| JP | 6-42343 | 11/1994 |
| JP | 2001-257291 | 9/2001 |
| JP | 2005-347514 | 12/2005 |

OTHER PUBLICATIONS

Notification on Patent Registration Formalities and Notification on Grant of Patent Right for Invention for Chinese Application No. 201110032402.6 dated Sep. 13, 2013.

* cited by examiner

PACKAGING STRUCTURE

CROSS-REFERENCE TO RELATED APPLICATIONS

The present application is a Section 371 National Stage Application of International Application No. PCT/CN2012/070629, filed on Jan. 20, 2012, which claims priority to Chinese patent application No. 201110032402.6, filed on Jan. 30, 2011, and entitled "SYSTEM-LEVEL FAN-OUT WAFER PACKAGING STRUCTURE", Chinese patent application No. 201120032087.2, filed on Jan. 30, 2011, and entitled "BEARING DEVICE FOR WAFER PACKAGING", Chinese patent application No. 201110032390.7, filed on Jan. 30, 2011, and entitled "HIGH-DENSITY SYSTEM-LEVEL CHIP PACKAGING STRUCTURE", Chinese patent application No. 201120032108.0, filed on Jan. 30, 2011, and entitled "WAFER PACKAGING STRUCTURE", and Chinese patent application No. 201110032264.1, filed on Jan. 30, 2011, and entitled "HIGH INTEGRITY WAFER FAN-OUT PACKAGING STRUCTURE", and the entire disclosures of which are incorporated herein by reference.

FIELD OF THE DISCLOSURE

The present disclosure generally relates to semiconductor technology, and more particularly, to a packaging structure.

BACKGROUND OF THE DISCLOSURE

Wafer Level Packaging (WLP) is a technology in which a whole wafer is packaged and tested, and then diced into individual chips. The size of a packaged chip is almost the same as that of a bare chip. Wafer Level Chip Size Packaging (WLCSP) technology is totally different from conventional packaging technologies such as Ceramic Leadless Chip Carrier and Organic Leadless Chip Carrier, and satisfies the market requirements for micro-electronic products, e.g., light in weight, small in size, thin in thickness and low in cost. Packaging with the WLCSP technology realizes high miniaturization, and the chip cost decreases significantly with the decrease of the chip size and the increase of the wafer size. The WLCSP technology, which, when being implemented, may take into account the IC design, wafer fabrication and packaging test in combination, is currently a focus in the packaging field and becomes one of the development trends of the packaging technologies.

Fan-out wafer packaging is one kind of WLP. For example, a wafer level fan-out chip packaging method, disclosed in a Chinese invention patent application No. 200910031885.0, includes following process steps: a stripping foil and a film dielectric layer I are sequentially formed on a surface of a wafer of a carrier, and a photoetching pattern opening I is formed on the film dielectric layer I; a metal electrode and a re-wiring metal routing wire which are connected with a base plate end are arranged on the photoetching pattern opening I and a surface thereof, and a film dielectric layer II is formed on a surface of the metal electrode, a surface of the re-wiring metal routing wire, and a surface of the film dielectric layer I which are connected with the base plate end, and a photoetching pattern opening II is formed on the film dielectric layer II; a metal electrode connected with a chip end is arranged on the photoetching pattern opening II; after a chip is arranged on the metal electrode connected with the chip end in an inverting way, the injection molding of packaging material and curing are performed, so as to form a packaging body with plastic-packaging material; the wafer of the carrier and the stripping foil are separated from the packaging body with plastic-packaging material, so as to form a plastic-packaging wafer; a solder ball is reflowed to form a bump; and singulation is performed to form the final structure of the fan-out chip.

Final products packaged and manufactured by the above method only have single-chip functions. To realize whole-system functions, besides a final product, a periphery circuit including all kinds of capacitors, inductors and resistors is required.

SUMMARY

Embodiments of the present disclosure may provide a high density packaging structure.

In an embodiment, a packaging structure may include: a carrier board, an adhesive layer on a surface of the carrier board, chips and passive devices attached to the adhesive layer, and a sealing material layer formed on a surface of the carrier board to which the chips and the passive devices are attached, the sealing material layer being adapted for packaging and curing.

Optionally, the sealing material layer may be further filled into the spaces between the chips, between the chips and the passive devices, and/or between the passive devices.

Optionally, the sealing material layer may have a thickness greater than anyone of the chips and the passive devices.

Optionally, the passive devices may include capacitors, resistors or inductors.

Optionally, the sealing material layer may be made of epoxy resin.

Optionally, the adhesive layer may be made of Ultraviolet (UV) adhesive.

Optionally, the chips may include a plurality of different chips.

Optionally, the carrier board may be made of glass.

Optionally, the chips and the passive devices may be devices to be packaged, and a shape and a position of the adhesive layer may correspond to shapes of functional surfaces of the devices to be packaged and positions on the carrier board where the devices to be packaged are to be attached, respectively.

Optionally, an alignment part may be disposed on the carrier board.

Optionally, a shape and a size of the alignment part may be determined by a plurality of location parts.

Optionally, the plurality of location parts may be cruciform, dual cruciform, star-shaped, L-shaped, dual-L-shaped or point-shaped.

Optionally, the adhesive layer may include a plurality of adhesive blocks separated from one another.

Optionally, at least two of the plurality of adhesive blocks may have different shapes.

Optionally, the plurality of adhesive blocks may be square, rectangular or circular.

Optionally, the plurality of adhesive blocks may be arranged on the carrier board in matrix.

Optionally, the plurality of adhesive blocks may be spaced at a same interval on the carrier board.

Optionally, the interval between the plurality of adhesive blocks may be determined according to the arrangement scheme of the devices to be packaged.

Optionally, the chips and the passive devices may be the devices to be packaged, and a groove may be formed on the sealing material layer in a position corresponding to the interval between the devices to be packaged.

Optionally, a plurality of grooves may be formed on the sealing material layer, and each groove may be a closed loop around the devices to be packaged.

Optionally, each of the grooves may define a square, a rectangle or a circle.

Optionally, any two adjacent grooves are spaced at a same interval.

Optionally, the grooves may be arranged in matrix.

Optionally, cross sections of the grooves may be U-shaped, V-shaped or concave.

Optionally, the grooves may have a depth less than a thickness of the sealing material layer.

Optionally, the grooves may have a depth greater than a difference between the thickness of the sealing material layer and a thickness of the devices to be packaged.

Optionally, the surface of the sealing material layer may expose the functional surfaces of the chips and the passive devices, and the packaging structure may further include: a metal re-wiring layer formed on the surface of the sealing material layer and electrically connected with the functional surfaces of the chips and the passive devices; a protective film layer formed on the surface of the sealing material layer, the protective film layer having an opening which exposes the metal re-wiring layer; a sub-ball metal layer formed in the opening and connected with the metal re-wring layer; and a metal welding ball formed on the sub-ball metal layer.

Compared with the conventional methods, the present disclosure has following advantages.

1. In the packaging structure in the present disclosure, since the chips and the passive devices are integrated and packaged together, the packaging structure is a packaging product including whole-system functions but not single-chip functions. Compared with conventional system-level packaging structures, the packaging structure in the present disclosure has high integrity, decreases interference factors in a system, such as resistors or inductors, and goes with the trend that semiconductor packaging is becoming light, thin and short.

2. In embodiments of the present disclosure, the shape and position of the adhesive layer formed on the carrier board may correspond to the shapes of the functional surfaces of the devices to be packaged and the positions on the carrier board where the devices to be packaged are to be attached, respectively, which facilitates the localization of mounting chips and avoids difficulty in peeling or widespread cleaning in subsequent processes 3. In embodiments of the present disclosure, the whole packaging of the sealing material layer is divided into a plurality of small devices to be packaged and the grooves between the devices to be packaged may reduce the inner stress of the sealing material layer, which avoids warp and distortion of the sealing material layer in subsequent processes during wafer packaging and improves the quality of wafer packaging products.

DETAILED DESCRIPTION OF THE DISCLOSURE

In the following description, for the purposes of explanation, numerous specific details are set forth in order to provide a thorough understanding of the present disclosure. It will be apparent, however, to those skilled in the art that the present disclosure may be practiced with other embodiments different from embodiments described below. Accordingly, the present disclosure is not restricted to the embodiments described.

Besides, embodiments of present disclosure will be described in detail in conjunction with accompanying drawings. The drawings as examples are not used to limit the present disclosure.

Figure 1:
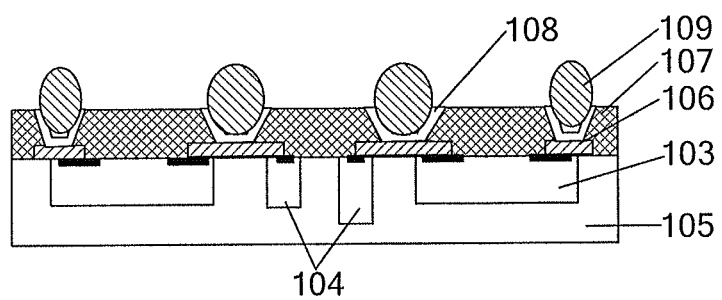
FIG. 1 schematically illustrates a packaging structure according to a first embodiment of the present disclosure.

FIG. 1 schematically illustrates a sectional view of a packaging structure according to a first embodiment of the present disclosure. The packaging structure may include: a sealing material layer 105, the sealing material layer 105 having a chip 103 and a passive device 104 packaged and cured therein and a surface of the sealing material layer 105 exposing functional surfaces of the chip 103 and the passive device 104; a metal re-wiring layer 106 formed on the surface of the sealing material layer 105 and electrically connected with the functional surfaces of the chip 103 and the passive device 104; a protective film layer 107 formed on the surface of the sealing material layer 105, the protective film layer 107 having an opening which exposes the metal re-wiring layer 106; a sub-ball metal layer 108 formed in the opening and connected with the metal re-wring layer 106; and a metal tin ball 109 formed on the sub-ball metal layer 108.

In the above packaging structure, since the chip 103 and the passive device 104 are integrated and packaged together, the packaging structure is a packaging product including whole-system functions but not single-chip functions. To further describe advantages of the packaging structure in the present disclosure, a packaging structure will be described in detail in conjunction with an embodiment of a packaging method in the present disclosure.

Embodiments of the present disclosure will be described in detail in conjunction with accompanying drawings.

Figure 2:
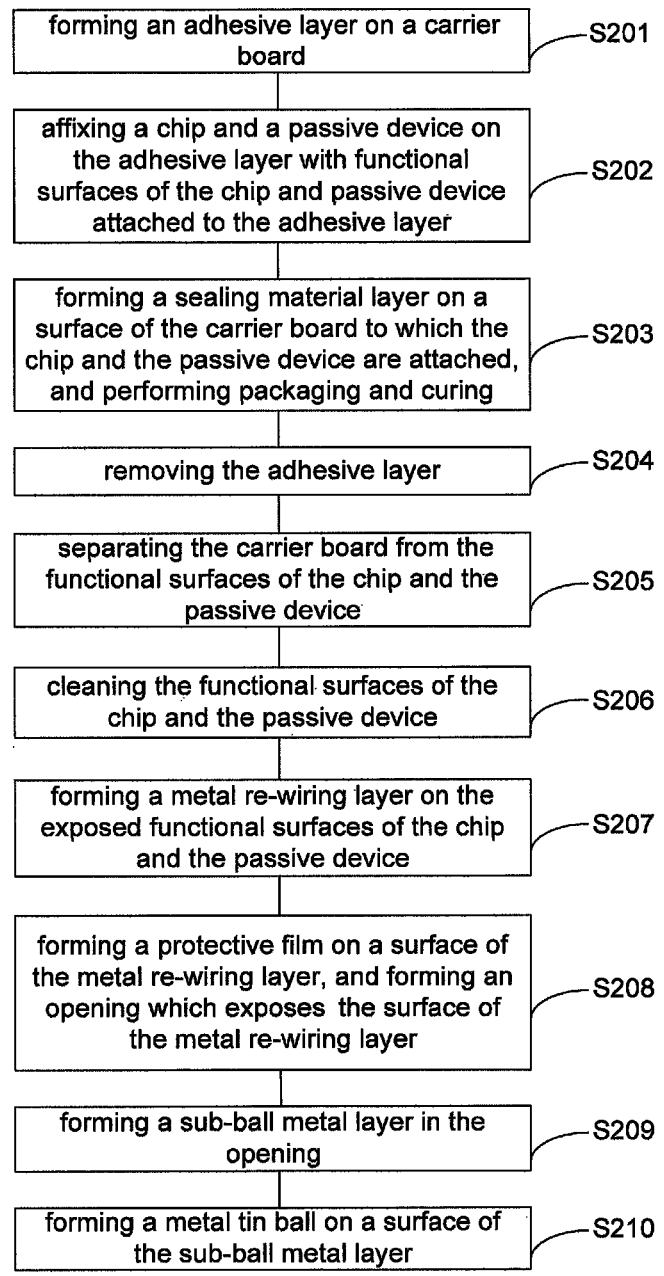
FIG. 2 schematically illustrates a flow chart of a first packaging method according to one embodiment of the present disclosure.

Referring to FIG. 2, a flow chart of a packaging method according to one embodiment of the present disclosure is illustrated. The packaging method may include steps of:

S201, forming an adhesive layer on a carrier board;

S202, affixing a chip and a passive device on the adhesive layer with functional surfaces of the chip and passive device attached to the adhesive layer;

S203, forming a sealing material layer on a surface of the carrier board to which the chip and the passive device are attached, and performing packaging and curing;

S204, removing the adhesive layer;

S205, separating the carrier board from the functional surfaces of the chip and the passive device;

S206, cleaning the functional surfaces of the chip and the passive device;

S207, forming a metal re-wiring layer on the exposed functional surfaces of the chip and the passive device;

S208, forming a protective film on a surface of the metal re-wiring layer, and forming an opening which exposes the surface of the metal re-wiring layer;

S209, forming a sub-ball metal layer in the opening; and

S210, forming a metal tin ball on a surface of the sub-ball metal layer.

Figure 3:
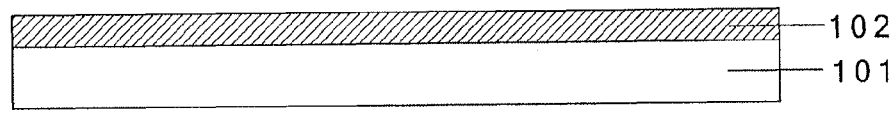
FIG. 3 to FIG. 10 schematically illustrate intermediate cross-sectional views of a packaging structure formed with the method shown in FIG. 2.

In some embodiments, S201 is performed first. An adhesive layer 102 may be formed on a carrier board 101, so as to form a structure shown in FIG. 3.

In S201, the carrier board 101 may be a base configured to bear a chip 103 and a passive device 104.

In some embodiments, the carrier board 101 may be made of glass, which may have a good hardness and evenness, and reduce failure rate of packaging devices. Besides, the carrier board 101 may be peeled in subsequent processes. Since the carrier board 101 made of glass is easily peeled and has a good resistance to corrosion, the carrier board 101 may not change in physical and chemical performance after contacting with the adhesive layer 102 and may be used repeatedly. It is well known in the art that a carrier board 101 made of other materials, such as silicon compound, may realize the objectives of the present disclosure as well.

The adhesive layer 102 formed on the carrier board 101 is adapted to fix the chip 103 and the passive device 104 on the carrier board 101. The adhesive layer 102 may be made of different materials. In some embodiments, the adhesive layer 102 may be made of UV adhesive. The UV adhesive is a kind of glue material which may react to the irradiation of UV-light having a particular wavelength. According to stickiness changes caused by the irradiation of UV-light, the UV adhesive can be divided into two kinds. The first kind is UV curable adhesive. Under the irradiation of UV rays, photoinitiator or photosensitizer in the material absorbs the UV-light and produces active radicals or positive ions, causing polymerization, cross-linking and grafting chemical reactions and changing the UV curable adhesive from a liquid state to a solid state in several seconds. In this manner, a surface of an object in contact with the material may be attached to the material. The second kind has a high stickiness without irradiation of UV rays. And after the irradiation of UV-light, cross-linked chemical bonds in the material may be broken, which causes the stickiness of the UV adhesive to decrease greatly or disappear. In some embodiments, the UV adhesive applied in the adhesive layer 102 may be the second kind.

The method for forming the adhesive layer 102 on the carrier board 101 may be spin coating or printing, which are well known to those skilled in the art and not described in detail here.

Figure 4:
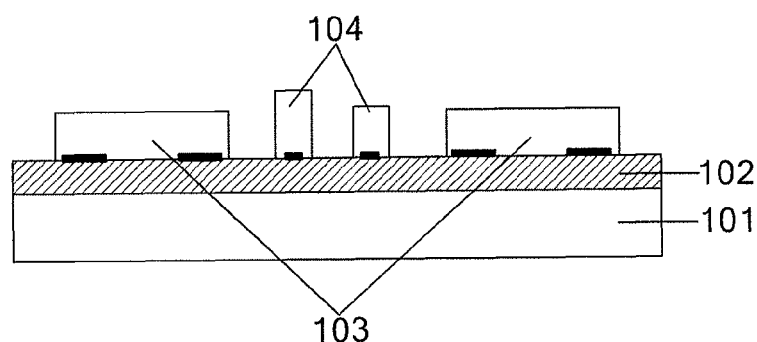

Thereafter, S202 may be performed. Functional surfaces of a chip 103 and a passive device 104 are affixed on the adhesive layer 102 to form a structure shown in FIG. 4.

In some embodiments, the functional surfaces of the chip 103 and the passive device 104 may refer to surfaces where a metal electrode of the chip 103 and a pad of the passive device 104 are disposed.

In some embodiments, the chip 103 attached to the adhesive layer 102 may include a plurality of different chips. The plurality of different chips may be a portion of a system-level packaging product and realize one or more independent functions of system-level functions respectively.

The passive device 104, realizing system-level functions of packaging products along with the chip 103, is an external circuit, such as capacitors, resistors or inductors. The passive device 104 and the chip 103 with different functions are combined as a whole and then packaged, which may realize the required system-level functions.

In some embodiments, the combination of the chip 103 and the passive device 104 may be designed according to system functions. Therefore, around a chip 103, there may be one or more chips 103 having same or different functions, or there may be one or more passive devices 104 having same or different functions, such as capacitors, resistors or inductors. Similarly, around a passive device 104, there may be one or more passive devices 104 having same or different functions, or there may be one or more chips 103 having same or different functions.

Figure 5:
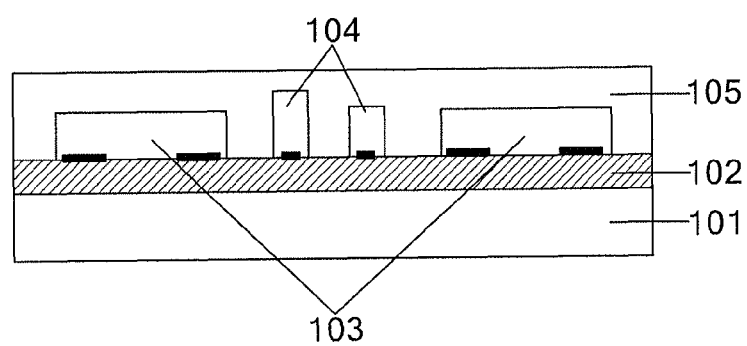

Thereafter, S203 is performed. A surface of the carrier board attached to the chip and passive device is packaged and cured, so as to form a packaging body with a sealing material layer 105, i.e., to form a structure shown in FIG. 5. In subsequent process steps, the packaging body may protect all the surfaces except the functional surfaces of the chip 103 and the passive device 104 and act as a carrier in the subsequent processes.

In some embodiments, the sealing material layer 105 may be made of epoxy resin. Epoxy resin is a good material for forming the sealing material layer 105 as it has good sealability and is easily shaped. A method for forming the sealing material layer 105 may be transfer molding or printing, which are well known to those skilled in the art and not described in detail here.

As described above, around a chip 103, there may be other chips 103 or passive devices 104. And around a passive device 104, there may be one or more passive devices 104 having same or different functions, or there may be one or more chips 103 having same or different functions. Therefore, spaces may exist around the chips 103 and the passive devices 104. To protect the chips 103 and the passive devices 104 better, the sealing material layer 105 may be filled into spaces between the chips 103, between the chips 103 and the passive devices 104, and/or between the passive devices 104.

The chip 103 may have a different thickness with the passive device 104, namely, the chip 103 may have a greater thickness, or the passive device 104 may have a greater one. Therefore, the sealing material layer 105 may have a thickness greater than anyone of the chip 103 and the passive device 104, which ensures better protection for the chip 103 and the passive device 104.

Thereafter, S404 may be performed. The adhesive layer 102 is removed. Since the adhesive layer 102 is organic and can be dissolved in certain organic solvent, the adhesive layer 102 may be removed by dissolving in an organic solvent.

Thereafter, S205 may be performed. The carrier board 101 is separated from the functional surfaces of the chip 103 and the passive device 104. Namely, after S204, the adhesive layer 102 is dissolved, or is molten and peelable. The carrier board 101 may be peeled from the functional surfaces of the chip 103 and the passive device 104 easily, exposing the functional surfaces of the chip 103 and the passive device 104.

Figure 6:
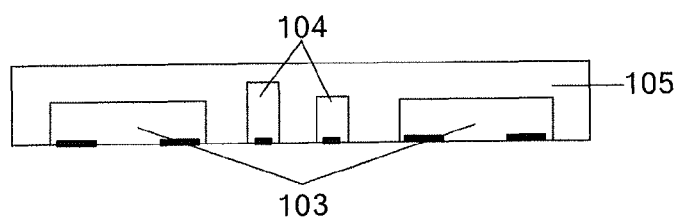
Figure 7:
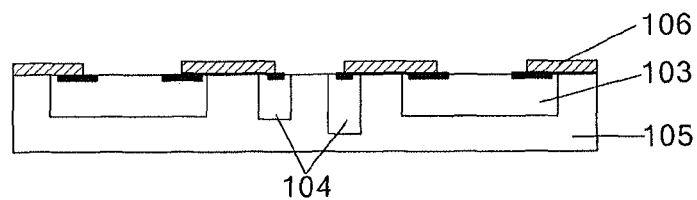
Figure 8:
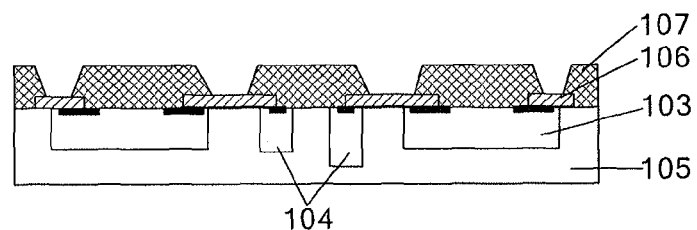
Figure 9:
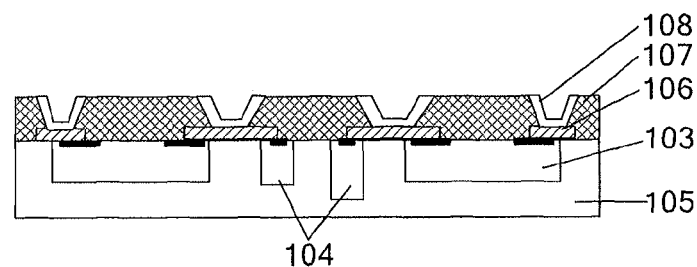
Figure 10:
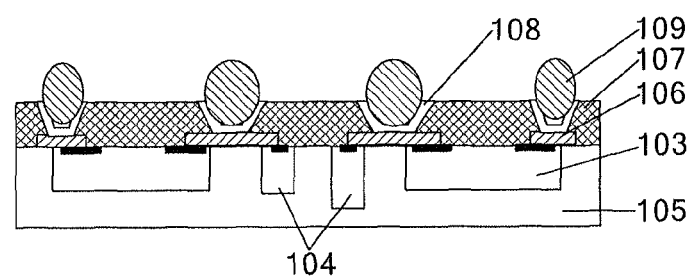

Thereafter, S206 may be performed. The functional surfaces of the chip 103 and the passive device 104 may be cleaned to remove the residual adhesive layer 102, so as to form a structure shown in FIG. 6. The chip 103 and the passive device 104 are no longer fixed together by the carrier board but by the packaging body, and the metal electrode of the chip 103 and the pad of the passive device 104 are exposed.

As shown in FIG. 7 to FIG. 10, S207 to S210 are performed, including: forming a metal re-wiring layer 106 on the exposed functional surfaces of the chip 103 and the passive device 104, so that the metal electrode of the chip 103 may be functionally connected to the pad of the passive device 104 in system level; forming a protective film 107 on a surface of the metal re-wiring layer 106, and forming an opening by design requirements on the protective film 107 to expose the metal re-wiring layer 106; forming a sub-ball metal layer 108 in the opening; and forming a metal tin ball 109 on a surface of the sub-ball metal layer 108. S207 to S210 can be performed similarly to existing fan-out wafer packaging methods, which are not described in detail here.

It should be noted that, the metal tin ball 109 here is just illustrated as an example and the present disclosure will not be limited thereto. A metal welding ball made of other materials may be formed.

After performing the above steps, the packaging is basically completed. In the above packaging method, functional surfaces of a chip and a passive device are affixed on an interposed medium carrier board, and packaging and curing are performed by using a sealing material layer. In this manner, the chip and the passive device are integrated and packaged together.

Figure 11:
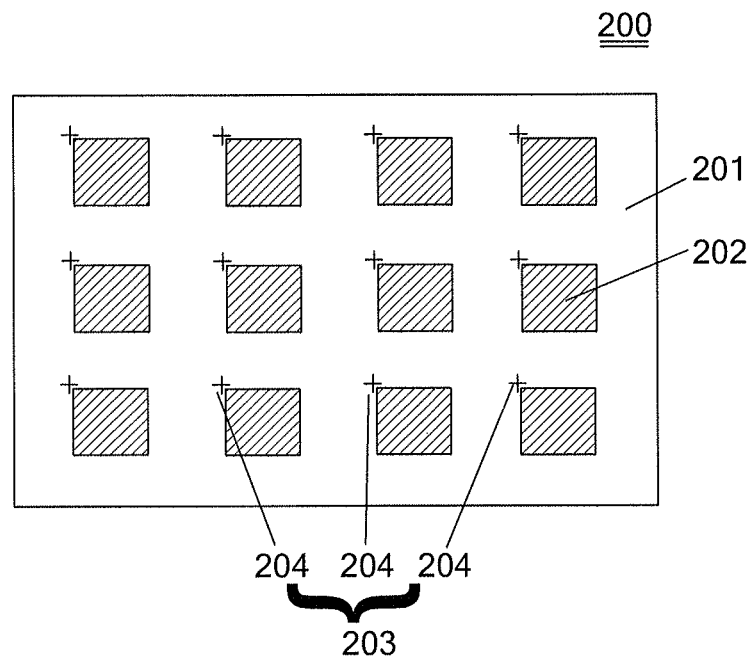
FIG. 11 schematically illustrates a packaging structure according to a second embodiment of the present disclosure.

As shown in FIG. 11, a packaging structure according to a second embodiment of the present disclosure is illustrated. The packaging structure 200 may include a carrier board 201 and an adhesive layer 202 on the carrier board 201.

The carrier board 201 may be adapted to bear devices to be packaged in subsequent steps. In some embodiments, the carrier board 201 may be made of glass, which may have a good hardness and evenness, and reduce failure rate of packaging. Besides, the carrier board 201 may be peeled in a packaging process. Since the carrier board 201 made of glass is easily peeled and has a good resistance to corrosion, the carrier board 201 may not change in physical and chemical performance after contacting with other coatings and may be used repeatedly.

The adhesive layer 202 formed on the carrier board 201 is adapted to fix devices to be packaged on the carrier board 201 in subsequent steps. The adhesive layer 202 may be made of different materials. In some embodiments, the adhesive layer 202 may be made of UV adhesive. The UV adhesive is a kind of glue material which may react to the irradiation of UV-light having a particular wavelength. According to stickiness changes caused by the irradiation of UV-light, the UV adhesive can be divided into two kinds. The first kind is UV curable adhesive. Under the irradiation of UV rays, photoinitiator or photosensitizer in the material absorbs the UV-light and produces active radicals or positive ions, causing polymerization, cross-linking and grafting chemical reactions and changing the UV curable adhesive from a liquid state to a solid state in several seconds. In this manner, a surface of an object in contact with the material may be attached to the material. The second kind has a high stickiness without irradiation of UV rays. And after the irradiation of UV-light, cross-linked chemical bonds in the material may be broken, which causes the stickiness of the UV adhesive to decrease greatly or disappear. In some embodiments, the UV adhesive applied in the adhesive layer 202 may be the second kind.

During wafer fan-out packaging, devices to be packaged, such as different chips and passive devices, may be affixed on the carrier board 201 by the adhesive layer 202. If without any other assistant measures, the devices to be packaged may not be arranged on the carrier board 201 accurately, which may cause defects or even failures of packaging products, thereby reducing packaging yield.

Therefore, in some embodiments, a shape and a position of the adhesive layer 202 may correspond to shapes of functional surfaces of the devices to be packaged and positions on the carrier board where the devices to be packaged are to be attached, respectively. In a subsequent adhesive process in wafer packaging, the devices to be packaged may be attached according to positions on the adhesive layer 202. Namely, the adhesive layer 202 may provide alignment for the devices to be packaged.

In some embodiments, the adhesive layer 202 on the carrier board 201 may be formed by a plurality of separated adhesive blocks. The separated adhesive blocks may be formed on the carrier board 201 by mask printing, stencil printing or pen-writing, which are well known to those skilled in the art and not described in detail here.

The plurality of adhesive blocks may be square, rectangular or circular, to meet the requirement that functional surfaces of different devices to be packaged have different shapes. In some embodiments, shapes of the plurality of adhesive blocks may be irregular, for example, an irregular pattern designed according to practical requirements.

As described above, during wafer fan-out packaging, devices to be packaged, such as different chips and passive devices, may be affixed on the carrier board 201 by the adhesive layer 202. Functional surfaces of different chips and different passive devices may have different shapes and sizes. Therefore, adhesive blocks may be formed to have different shapes according to requirements. In some embodiments, at least two adhesive blocks have different shapes among the plurality of adhesive blocks formed on the carrier board 201. This design is determined according to characteristics of fan-out wafer packaging, but the present disclosure will not be limited thereto. In some embodiments, the chips having different functions may have a same size, and the plurality of adhesive blocks may have a same shape.

The plurality of adhesive blocks may be arranged on the carrier block 201 in matrix. In some embodiments, during system-level fan-out wafer packaging, the plurality of adhesive blocks may be arranged according to distribution of devices to be packaged including chips and passive devices. The chips and the passive devices may form a system unit according to design requirements and system units may be arranged in matrix. In some embodiments, distance between the matrixes may be the same as that between the adhesive blocks of the devices to be packaged to meet the requirement of a subsequent sealing process.

Besides, an alignment part 203 may be formed on the carrier board 201, adapted to determine a direction of the devices to be packaged to make the devices to be packaged face a certain direction according to requirements, so as to avoid mistakes, such as an upside down direction. Therefore, during a subsequent adhesive process for devices to be packaged in wafer packaging, an attaching direction of the devices to be packaged may be determined according to the alignment part 203 directly.

In practice, shapes of the alignment part 203 may be determined according to shapes of functional surfaces of the devices to be packaged, such as a square, a rectangle or a circle. The alignment part 203 may be formed on the carrier board 201 by etching or laser-writing, which are well known to those skilled in the art and not be described in detail here.

In above embodiments, the adhesive layer 202 includes a plurality of adhesive blocks separated from one another, but the present disclosure is not limited thereto. In some embodiments, the alignment part 203 may be formed as a whole and not separated. Accordingly, the adhesive layer 202 may be formed as a whole and not include a plurality of separated adhesive blocks.

Figure 12:
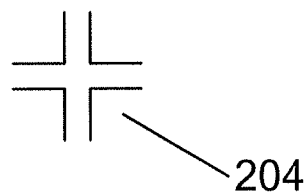
FIG. 12 schematically illustrates a location part shown in FIG. 11 according to a first embodiment of the present disclosure.
Figure 13:
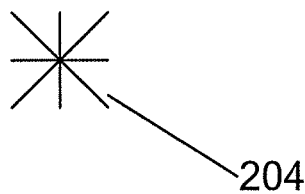
FIG. 13 schematically illustrates a location part shown in FIG. 11 according to a second embodiment of the present disclosure.
Figure 14:
FIG. 14 schematically illustrates a location part shown in FIG. 11 according to a third embodiment of the present disclosure.
Figure 15:
FIG. 15 schematically illustrates a location part shown in FIG. 11 according to a fourth embodiment of the present disclosure.

A shape and size of the alignment part 203 may be determined by a plurality of location parts 204. In some embodiments, the plurality of location parts 204 may be cruciform, as shown in FIG. 12, or dual cruciform, or star-shaped, as shown in FIG. 13, or L-shaped, as shown in FIG. 14, or dual-L-shaped, as shown in FIG. 15. Similarly, in these embodiments, the plurality of location parts 204 may be formed on the carrier board 201 by etching or laser-writing.

Figure 16:
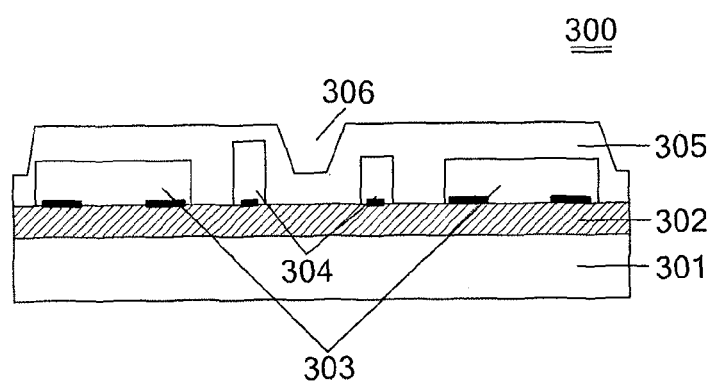
FIG. 16 schematically illustrates a packaging structure according to a third embodiment of the present disclosure.

As shown in FIG. 16, a packaging structure according to a third embodiment of the present disclosure is illustrated. A packaging structure 300 may include a carrier board 301 and an adhesive layer 302 on the carrier board 301.

The carrier board 301 may be adapted to bear subsequent devices to be packaged. In some embodiments, the carrier board 301 may be made of glass, which may have a good hardness and evenness, and reduce failure rate of packaging. Besides, the carrier board 301 may be peeled in a packaging process in practice. Since the carrier board 301 made of glass is easily peeled and has a good resistance to corrosion, the carrier board 301 may not change in physical and chemical performance after contacting with other coatings and may be used repeatedly.

The adhesive layer 302 formed on the carrier board 301 is adapted to fix devices to be packaged on the carrier board 301 in subsequent steps. The adhesive layer 302 may be made of different materials. In some embodiments, the adhesive layer 302 may be made of UV adhesive. The UV adhesive is a kind of glue material which may react to the irradiation of UV-light having a particular wavelength. According to stickiness changes caused by the irradiation of UV-light, the UV adhesive can be divided into two kinds. The first kind is UV curable adhesive. Under the irradiation of UV rays, photoinitiator or photosensitizer in the material absorbs the UV-light and produces active radicals or positive ions, causing polymerization, cross-linking and grafting chemical reactions and changing the UV curable adhesive from a liquid state to a solid state in several seconds. In this manner, a surface of an object in contact with the material may be attached to the material. The second kind has a high stickiness without irradiation of UV rays. And after the irradiation of UV-light, cross-linked chemical bonds in the material may be broken, which causes the stickiness of the UV adhesive to decrease greatly or disappear. In some embodiments, the UV adhesive applied in the adhesive layer 302 may be the second kind.

During system-level wafer packaging, devices to be packaged attached on the adhesive layer 302 may include a plurality of chips 303, or further include a plurality of passive devices 304. The plurality of chips 303 may include a plurality of different chips, which become a portion of a system-level packaging product respectively. The passive devices 304, realizing system-level functions of packaging products along with the chips 303, are external circuits, such as capacitors, resistors or inductors. The passive devices 304 and the chips 303 with different functions are combined as a whole and then packaged, which may realize the required system-level functions. Besides, the devices to be packaged on the adhesive layer 302 may include chips and passive devices.

A sealing material layer 305 is formed on a surface of the carrier board 301 to which the chip 303 and the passive device 304 are attached. In subsequent process steps, a packaging body may protect all the surfaces except the functional surfaces of the chip 303 and the passive device 304 and act as a carrier in the subsequent processes. In some embodiments, the sealing material layer 305 may be made of epoxy resin. Epoxy resin is a good material for forming the sealing material layer 305 as it has good sealability and is easily shaped.

Since the sealing material layer 305 and the carrier board 301 may have different thermal shrinkage ratios, inner stress of the sealing material layer 305 may be nonuniform, which may cause warp and distortion of the sealing material layer 305 in subsequent processes during wafer packaging and adversely influence the quality of packaging products.

Figure 17:
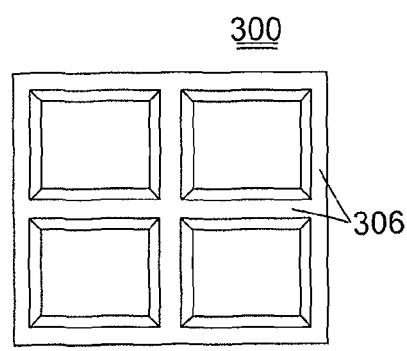
FIG. 17 schematically illustrates a groove shown in FIG. 16 according to one embodiment of the present disclosure.

As shown in FIG. 17, in some embodiments, a groove 306 may be formed on the sealing material layer 305 in a position corresponding to the interval between the devices to be packaged. The groove 306 may be formed after printing based on the design of stencil aperture and depth. With the groove 306, stress in the sealing material layer 305 may be balanced, thereby warp and distortion of the sealing material layer 305 in subsequent processes during wafer packaging may be avoided.

Cross section of the groove 306 may be designed according to stress in the sealing material layer 305 and profiles of the devices to be packaged. In some embodiments, the cross section of the groove 306 may be U-shaped, V-shaped or concave.

A depth of the groove 306 may be related to the design of the stencil. The groove 306 with a depth set according to the design of the stencil may effectively balance the inner stress of the sealing material layer 305.

In some embodiments, a plurality of grooves 306 may be formed on the sealing material layer, and each groove may be a closed loop around the devices to be packaged. The closed loop may effectively reduce the stress around the chip 303 and the passive device 304 from the sealing material layer 305 and further balance the distribution of inner stress of the sealing material layer 305. Each groove 306 may be loop-shaped and define a square, a rectangle or a circle. Devices to be packaged in a closed loop formed by each groove 306 may include a plurality of chips 303 or a combination of passive devices 304. The devices to be packaged are arranged in matrix and the grooves 306 are disposed among the devices to be packaged, namely, the devices to be packaged are interlaced with the grooves 306.

The plurality of loop-shaped grooves 306 may be arranged in many ways so as to adapt to different arrangements of the chip 303 and the passive device 304. In some embodiments, the plurality of loop-shaped grooves 306 may be arranged in matrix.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A system-level fan-out wafer packaging structure, comprising: a carrier board, an adhesive layer on a surface of the carrier board, chips and passive devices whose functional surfaces are attached to the adhesive layer, and a sealing material layer formed on a surface of the carrier board to which the chips and the passive devices are attached, wherein the carrier board is made of glass, the adhesive layer is made of ultraviolet adhesive, the functional surfaces of the chips and the functional surfaces of the passive devices locate on a same surface, the sealing material layer is adapted for packaging and curing and has a thickness greater than anyone of the chips and the passive devices, and a plurality of grooves are formed on the sealing material layer,
   wherein each of the plurality of grooves forms a closed loop surrounding at least one of the chips and the passive devices, and is adapted to reduce stress from the sealing material layer; and
   wherein a depth of the groove is determined based on the stress in the sealing material layer.

2. The system-level fan-out wafer packaging structure according to claim 1, wherein the sealing material layer is further filled into spaces between the chips, between the chips and the passive devices, and/or between the passive devices.

3. The system-level fan-out wafer packaging structure according to claim 1, wherein the passive devices comprise capacitors, resistors or inductors.

4. The system-level fan-out wafer packaging structure according to claim 1, wherein the sealing material layer is made of epoxy resin.

5. The system-level fan-out wafer packaging structure according to claim 1, wherein the chips comprise a plurality of different chips.

6. The system-level fan-out wafer packaging structure according to claim 1, wherein the chips and the passive devices are devices to be packaged, and the plurality of grooves are formed on the sealing material layer in positions corresponding to intervals between the devices to be packaged.

7. The system-level fan-out wafer packaging structure according to claim 6, wherein the plurality of grooves are arranged in matrix.

8. The system-level fan-out wafer packaging structure according to claim 1, wherein a cross section of the groove is U-shaped, V-shaped or concave.

9. The system-level fan-out wafer packaging structure according to claim 1, wherein the chips and the passive devices are devices to be packaged, and a shape and a position of the adhesive layer correspond to shapes of the functional surfaces of the devices to be packaged and positions on the carrier board where the devices to be packaged are to be attached, respectively.

10. The system-level fan-out wafer packaging structure according to claim 9, wherein an alignment part is disposed on the carrier board.

11. The system-level fan-out wafer packaging structure according to claim 10, wherein a shape and a size of the alignment part are determined by a plurality of location parts.

12. The system-level fan-out wafer packaging structure according to claim 11, wherein the plurality of location parts are cruciform, dual cruciform, star-shaped, L-shaped, dual-L-shaped or point-shaped.

13. The system-level fan-out wafer packaging structure according to claim 9, wherein the adhesive layer comprises a plurality of adhesive blocks separated from one another.

14. The system-level fan-out wafer packaging structure according to claim 13, wherein at least two of the plurality of adhesive blocks have different shapes.

15. The system-level fan-out wafer packaging structure according to claim 13, wherein the plurality of adhesive blocks are arranged on the carrier block in matrix.

16. The system-level fan-out wafer packaging structure according to claim 1, wherein the plurality of grooves are formed by stencil printing.

* * * * *